United States Patent [19]
Aslan

[11] Patent Number: 4,518,912
[45] Date of Patent: * May 21, 1985

[54] RADIATION DETECTOR

[75] Inventor: Edward E. Aslan, Plainview, N.Y.

[73] Assignee: The Narda Microwave Corporation, Hauppauge, N.Y.

[*] Notice: The portion of the term of this patent subsequent to Feb. 8, 1989 has been disclaimed.

[21] Appl. No.: 893,588

[22] Filed: Apr. 5, 1978

Related U.S. Application Data

[60] Continuation of Ser. No. 678,901, Apr. 21, 1976, abandoned, which is a continuation of Ser. No. 423,754, Dec. 11, 1973, abandoned, which is a division of Ser. No. 200,536, Nov. 19, 1971, Pat. No. 3,794,914, and a continuation-in-part of Ser. No. 848,620, Aug. 8, 1969, Pat. No. 3,641,439.

[51] Int. Cl.³ .................... G01R 5/26; G01R 21/04
[52] U.S. Cl. .................... 324/95; 324/106; 343/703; 455/67
[58] Field of Search ............. 324/95, 106; 343/703; 325/67, 363; 455/67, 115; 340/600

[56] References Cited

U.S. PATENT DOCUMENTS

| | | | |
|---|---|---|---|
| 2,106,768 | 2/1938 | Southworth | 324/95 |
| 2,365,207 | 12/1944 | Moles | 343/703 |
| 2,430,664 | 11/1947 | Bradley | 324/106 |
| 3,109,988 | 11/1963 | Hoover | 324/106 |
| 3,421,081 | 1/1969 | Schneider | 324/106 |
| 3,641,439 | 2/1972 | Aslan | 324/95 |
| 3,931,573 | 1/1976 | Hopfer | 324/95 |

FOREIGN PATENT DOCUMENTS 954559  4/1964  United Kingdom ............... 324/95

OTHER PUBLICATIONS

Greene(I); "A New Near-Zone . . . "; J. of Research of the NBS; vol. 71-C; No. 1; Jan.-Mar. 1967, pp. 51-57.
Greene(II); "NBS Field-Strength . . . "; Proc. of the IEEE, vol. 55; No. 6; Jun. 1967; pp. 970-981.

*Primary Examiner*—Ernest F. Karlsen
*Attorney, Agent, or Firm*—Brumbaugh, Graves, Donohue & Raymond

[57] ABSTRACT

A radiation detector utilizing thin film thermocouples serially connected in an array and substantially disposed within a plane, said thermocouples being selectively mounted for non-perturbing introduction into the near-field region of an electric field.

3 Claims, 9 Drawing Figures

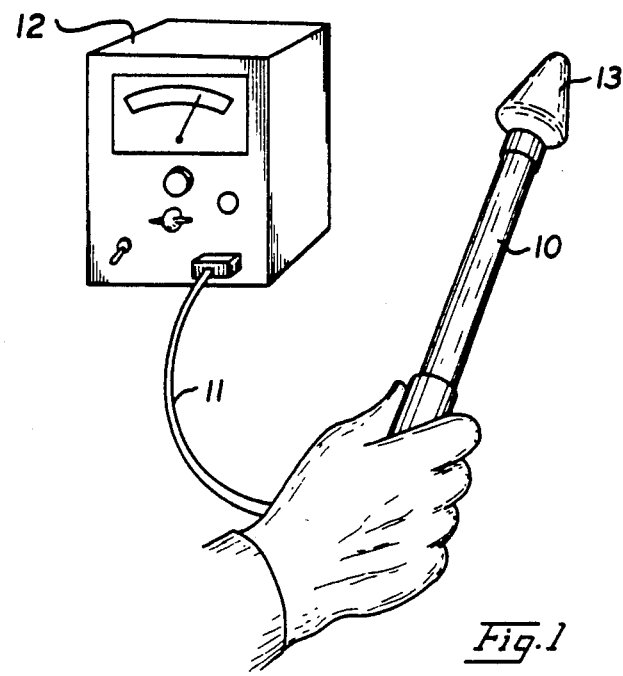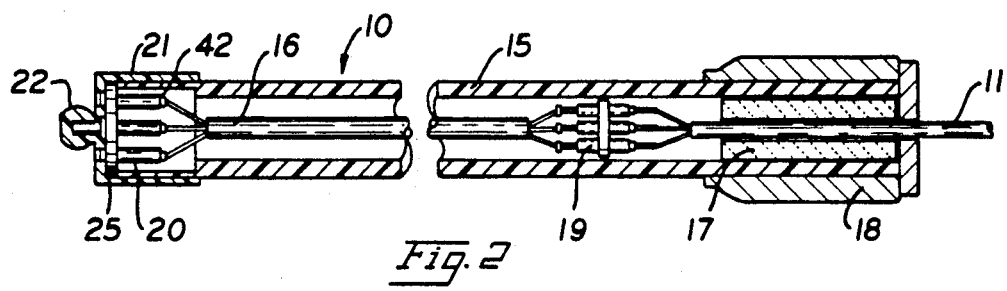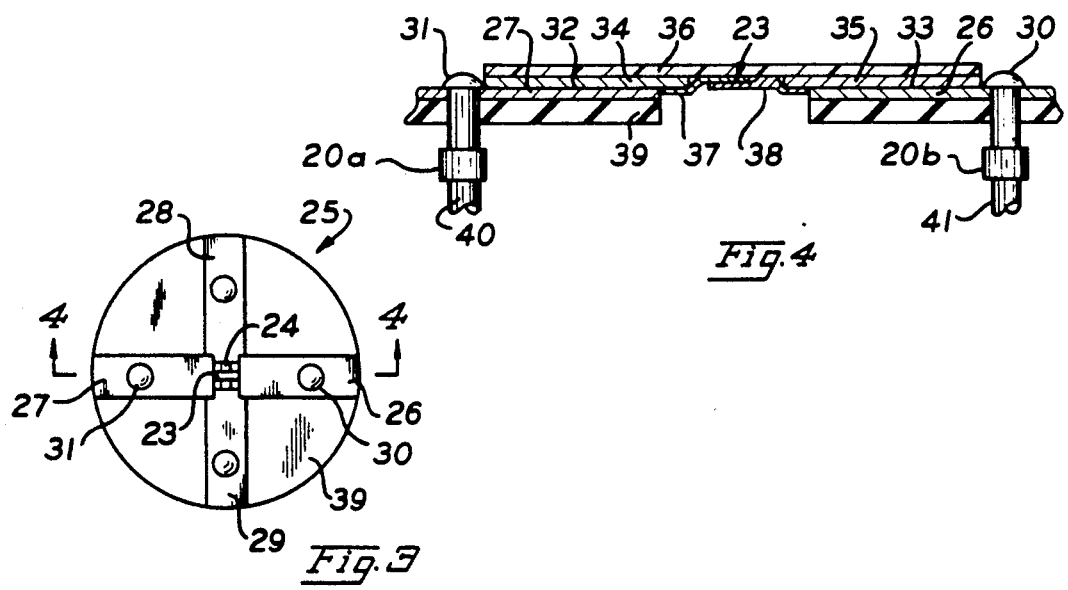

RADIATION DETECTOR

This application is a continuation of copending application Ser. No. 678,901 filed Apr. 21, 1976, now abandoned, which prior application was a continuation of previously copending application Ser. No. 423,754 filed Dec. 11, 1973, now abandoned, which latter application was a divisional of copending application Ser. No. 200,536, filed Nov. 19, 1971, now U.S. Pat. No. 3,794,914, which latter application was a continuation-in-part of copending application Ser. No. 848,620 filed Aug. 8, 1969, now U.S. Pat. No. 3,641,439.

BACKGROUND OF THE INVENTION

1. Field of the Invention

This invention relates to high frequency power density measurements; and more particularly relates to the measurement of high frequency, or microwave, power density with portable instruments.

The increasing use of microwave energy for such purposes as consumer and industrial heating ovens, has placed possibly dangerous microwaves energy sources in close proximity to large numbers of inexperienced people. It is essential that units utilizing microwave energy include proper shielding in order to avoid endangering those in close promixity thereto. In order to continually monitor the effectiveness of any shielding provided, and in order to initially insure its proper installation, radiation detectors must be provided to measure any leakage radiation that may appear. The necessary measurements of the radiated power should be made in close proximity to the units being tested and yet the measuring instrument should not perturb the field. Such measurements should preferably be independent of the polarization of the incident energy field and independent of ambient temperature and infrared radiation. Furthermore, it is of importance that the monitoring device or instrument be completely reliable inasmuch as such radiation is not apparent with the use of the normal human faculties.

2. Description of the Prior Art

It has been known that thin film thermocouple elements may be used to terminate a transmission line. When connected this way, the thermocopule will be heated by an amount proportional to the power dissipated therein. This heating effect creates a voltage across the thermocouple and the value of the voltage is a direct indication of the amount of power absorbed by the thermocouple. These characteristics of thermocouples have made them a basic element in the measurement of radio frequency power.

Most measurements of microwave power are made within wave guides wherein the thermocouple can be designed and selectively positioned in order to avoid reflection of the power and wherein the environment of the thermocouples can be carefully controlled. There are no known prior developments of thermocouple probes which can be used in free space to measure microwave radiation in the near field or Fresnal region, without disturbing the field.

Thermistors or bolometers have also been used to measure radio frequency power. In some applications, for example, such elements are positioned in one leg of a bridge circuit so that the power required to maintain the bridge in balance is an indication of the amount of power aborbed by the thermistor. Such elements are generally not suitable for the type of monitor contemplated by this invention because their sensitivity is directly related to the ambient temperature and this cannot be adequately controlled.

Crystal arrangements have also been employed to indicate power density. It is known that crystals have a square law characteristic which makes them adequate for monitoring relatively low power densities. However, the restrictions of such elements to low power applications, coupled with a relatively narrow square law range, makes them unsatisfactory, for monitors of the type herein contemplated.

SUMMARY OF THE INVENTION

The present invention relates to a completely portable detector effective to detect and measure microwave radiation leakage of elements such as microwave ovens, heaters, driers, medical equipment, and the like.

At the present time, 915 MHz and 2450 MHz are the frequencies most commonly used in the type of equipment mentioned. These frequencies have been assigned by the Federal Communications Commission for industrial, medical, and scientific devices and are the only two frequencies being used for consumer ovens. Whereas the present invention may be suitable for consumer oven measurements, it is also contemplated that measurements may be made over broader bands by incorporating the features of certain embodiments.

An object of the present invention is to provide a portable radiation detector.

Another object of the invention is to provide a portable radiation detector having minimum perturbation effects upon the field being examined.

A further object of the present invention is to provide a portable microwave detector that is operable close to the source of possible radiation.

Still another object of the present invention is to provide a portable microwave detector which is independent of polarization of the incident energy field.

Another object of the present invention is to provide a portable microwave detector which is substantially independent of ambient temperatures and infrared radiation.

Another object of the invention is to provide a portable microwave detector suitable for broad band frequency operation.

Still another object of the present invention is to provide an improved radiation detector utilizing selectively designed thermocouples.

In accordance with the invention, there is provided a radiation detector comprising a plurality of thin film thermocouples forming dipoles and operative in response to an electric field to produce currents commensurate with the intensity thereof, said thermocouples being serially connected and disposed substantially within a plane, said thermocouples each comprising resistive films of dissimilar material, and elongated means projecting orthogonally from said plane for introducing said thermocouple means into the near field region of said electric field.

A more thorough understanding of the invention, along with a better appreciation of the objects and novel features thereof, will be available following a consideration of the following description which is made in conjunction with the attached drawings.

BRIEF DESCRIPTION OF THE DRAWINGS

FIG. 1 illustrates an embodiment of the invention comprising a hand-held probe unit and indicating device;

FIG. 2 is a cross-sectional view taken along the longitudinal axis of a probe embodying the invention;

FIG. 3 is a top view of a sensor assembly adapted for mounting upon the probe illustrated in FIG. 2;

FIG. 4 is an elevation view of a cross-section taken through the sensor assembly of FIG. 3 when only one thermocouple is mounted thereon;

DESCRIPTION OF THE PREFERRED EMBODIMENT

Figure 5:
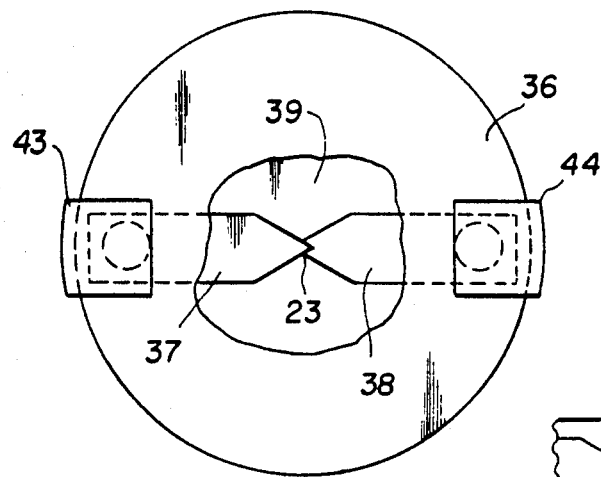
FIG. 5 is a top view of a sensor assembly according to another illustrative embodiment of the invention.

FIG. 1 illustrates the major components of a radiation detector embodying the present invention. These components include a hand-held probe 10 having an antenna or spacer member 13. The probe is connected by a coaxial cable 11 to an electronic voltmeter 12. Typically, probe 10 may be tubular in shape, 12 inches long, and approximately ¾ of an inch in diameter. Spacer 13 may be made of material having free space characteristics and is generally designed to permit positioning of the end of the probe 10 a predetermined distance from the source of radiation. This is of particular value when one is dealing with measurements from ovens and the like. The spacer is conical in configuration; the rear surface being perpendicular to its axis and being adapted under certain conditions to mount extending antenna portions.

The cross-sectional view of probe 10, shown in FIG. 2, illustrates the interconnection of the thermocouple elements to the coaxial cable 16 at the front end of the probe. The head of the probe includes a projection 22 adapted to serve as an anchoring or mounting element for spacer-adapter 13. This mounting element may preferably be a projection from cap portion 21 which encircles the barrel 15. The thermocouple elements 23, 24 make up the sensor assembly 25 that is illustrated in more detail in FIGS. 3 and 4. Lead sockets 42 couple sensor assembly 25 to four separate conductors of a cable 16. Ferrite beads 20 isolate R.F. from cable 16. A half wave length from the sensor assembly, four R.F. by-pass feed-through capacitors 19 interconnect cable 16 with output cable 11. Thus, cable 11 presents to the electronic voltmeter 12, a voltage proportional to the R.F. power impinging upon the sensor assembly.

The handle of probe 10 includes an outer tubular element 18 and an inner coaxial tube of lossey ferrite material surrounding cable 11. Typically, this surrounding tube 17 offers 30 db of attenuation at the expected frequency of probe operation. It will be seen that the lead wires 11 which carry the direct current output of the thermocouple are shielded with aluminum or other suitable materials and further that they are maintained perpendicular to the plane of the sensor assembly 25. This orientation of the lead wires makes them essentially invisible to the propagated wave when the antenna is placed parallel to the phase front.

With reference to FIG. 3, it will be noted that the sensor assembly 25 includes orthogonally disposed thermocouple elements 23 and 24 connected to antenna conductor strips 26, 27, and 28, 29, respectively. The antenna strips are in turn mounted upon a suitable substrate 39 which is adapted for mounting on the end of the probe 10. The particular manner of mounting is not germane to the invention, although the assembly must be substantially orthogonal to the axis of the probe. In order to reduce the potential measuring discrepancies arising from the thermocouples being subjected to different ambient temperatures, they are positioned in the same ambient environment. In a particular embodiment, the hot and cold junctions are separated by a distance of 0.015 inch.

FIG. 4 shows in somewhat greater detail the actual assembly of a single thermocouple and the manner in which it is mounted upon substrate 39. The substrate may be made up of a number of suitable materials, phenolic or glass filled epoxy having been found to be acceptable. Antenna strips 26 and 27 are either deposited or otherwise mounted upon the substrate 39 in conventional fashion. A conductive silver paint, or the like, 32, 33, may then be applied adjacent the inner edges of an aperture formed within the substrate 39, and on top of this conducting silver paint, silver films 34 and 35 are positioned. The function of the silver films 34 and 35 is to provide for the mounting of the actual thermocouple element which may comprise, for example, antimony and bismuth strips 37 and 38, respectively. It has also been found that an upper layer 36 of Kapton or the like provides desirable structural and electrical characteristics. The illustrated assembly is then secured in position and connected to two of the lead-out wires forming cable 16 by means of connectors 30 and 31. The second thermocouple, of substantially identical construction, is mounted orthogonally to that shown in FIG. 4 and thereby completes the general assembly illustrated in FIG. 3.

It is important to note that the dimensions in the drawing have been chosen for clarity of illustration and should not be used to suggest the relative sizes of the various elements and thin films. The construction of the illustrated sensor assembly permits the evaporation of all elements into position, in order to create a structure which will function as an antenna (i.e., films 34, 35) terminated by a load (i.e., thermocouple 23) that is also a detector.

In accordance with the understanding of those in this field of activity, it will be appreciated that each thermocouple 23, 24 defines in effect a hot junction at the junction between the two resistive thin film strips of dissimilar metals 37, 38. For purposes of this disclosure, a resistive film is one in which the ratio of the reactance to the resistance is less than one. This transition, or definite number "one" is selected to provide a generally acceptable instrument exhibiting a 3 db bandwidth over the frequency range contemplated. Thermally and electrically conductive strips 34, 35 are adapted for positioning within the field to be monitored in order to absorb power therefrom and effect heating of the hot junction. The voltage developed at the hot junction is proportional to the difference in temperature between it and the cold junctions formed at the connections between strips 37 and 34, and between strips 38 and 35. Since the hot and cold junctions can be closely spaced, ambient temperature conditions can be virtually ignored.

It is possible to control sensitivity of the detector unit by varying the substrate and the dimensions of the hot junction of the thermocouple. The particular frequency being monitored determines the length of the antenna which is a small fraction of the wave length at that frequency. By maintaining the antenna of small size, the unit is capable of measuring and monitoring power density with a minimum of field perturbation. In one embodiment of the invention, wherein the probe is used for measuring energy in the 2450 MHz range, the antenna strips have a combined length of approximately ¾ of an inch. The conical space-antenna 13 is attachable to the end of probe 10 in order to provide accurate spacing from a source of radiation leakage and simultaneously provides mounting means for antenna extensions. Thus, for frequencies in the 915 MHz range, the rear face of cone 13 contains orthogonally disposed conductive strips which connect to strips 26-29 of sensor assembly 25 and provide an antenna length of approximately 2 inches. Suitable pin-type connectors may be used for this purpose.

The direct current outputs from the thermocouples 23, 24 are connected in series to the electric voltmeter 12. Specifically, the positive side of thermocouple 23 is connected to the negative side of thermocouple 24 by joining the appropriate two of the four lead wires in cable 11 at the meter. The negative side of thermocouple 23 and the positive side of thermocouple 24 are connected to the negative and positive inputs, respectively, of the voltmeter 12 by the remaining two leads in the cable 11. This provides the necessary series connection. Since the thin film elements on the sensor assembly 25 are perpendicular to each other, the total direct current output voltage is independent of probe orientation and field polarization about the axis of the probe. Each antenna is terminated in an element that produces a direct current output proportional to the square of the electric field intensity component parallel thereto. The sum of these outputs is proportional to the power density and independent of orientation because of this square law characteristic of the thermocouple. Since it is known that the proportionality constant between field intensity and power density is 377 ohms in a far field, this constant is employed to calibrate the output in terms of power density. All probes are calibrated in a far field and the electronic voltmeter 12 may thus be adapted to read field density in mw/cm$^2$.

As previously noted, instruments of the nature herein contemplated, must at all times be reliable because the human faculties are unable to sense the power being measured. With the radiation monitor of the present invention, a very simple fail-safe technique may be employed. It is contemplated that a small constant direct current will be connected and passed through the thermocouple elements at all times. The resultant voltage developed in the thermocouple is balanced out at the input to the voltmeter so that no significant reading appears thereon. Using this constantly applied power, in the event that excessive power is applied to the antenna during normal operation, thereby destroying the thermocouple, the voltage applied to the voltmeter will go up, indicating a full scale meter reading and, if desired, sounding an alarm.

It is important to note that because of the unfiltered supply voltages frequently used on magnetrons and due to the rotation of stirrers in microwave ovens, peak to average power ratios are in the order of 10:1. Such peak power pulses have been found to be approximately 8 milliseconds long. It is possible that such power pulses may persist for a sufficiently long period to burn out the thermocouple elements.

In order to overcome this problem, the time constant of the elements is suitable chosen. An increase of the surface area of the thermocouple in contact with the substrate has been found to be an effective way of effecting this time constant selection. Changing the conductivity of the substrate or thickness without changing the geometry of the element does not change the time constant. A second method of increasing the time constant is by depositing a passive resistive film terminating the dipole on one side of the substrate. This film is essentially matched to the dipole, and in a particular example, exhibited a resistance on the order of 100 ohms, so that the maximum R.F. power would be dissipated in the element. It is advantageous to make the element of a high temperature melting material so that is can absorb large amounts of energy without damage. On the opposite side of the substrate there is mounted another dipole with a very low resistance thermocouple so that very little R.F. energy is dissipated therein. This second thermocouple will be heated by the energy in the passive element. The time constant is dependent on the thickness of the substrate, i.e. the time required for the heat to pass from the passive element through the substrate into the active thermocouple element. The direct current output of the thermocouple is then connected to the mater for power indication purposes.

In the event that faster time constant elements are desired so that peak power density may be measured, the width of the thermocouple element may be decreased. In this case, the meter may be designed to indicate peak as well as average power as a switched function.

In order to use the radiation detector of this invention for broadband frequency operation one may substitute resistive films for the electrically conductive films and produce the hot and cold junctions by shaping of the resistive films so that higher temperatures are obtained at the hot junctions than at the cold junctions. A number of techniques may be used to accomplish this. For example, higher resistance may be used at the hot junction where more power will be dissipated; or a substrate of different thermal conducitivity may be used, with a higher thermal conductive material beneath the cold junctions.

Figure 6:
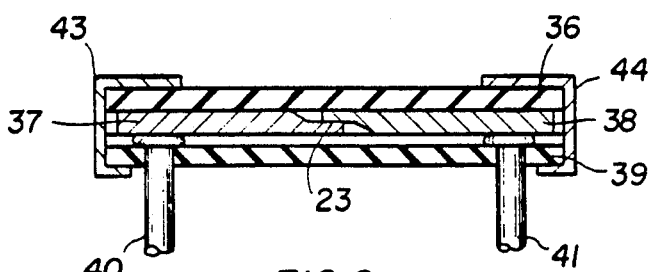
FIG. 6 is an elevation view of a cross-section taken along line 6—6 through the sensor assembly illustrated in FIG. 5.

FIGS. 5 and 6 illustrate a sensor assembly suitable for mounting on the probe discussed hereinbefore, and effective to detect a broad range of frequencies. In this assembly, the thermocouple 23 is again illustrated as made up of thin resistive films 37 and 38; however, it will be seen that these films extend beyond the previously described length and in effect function as the antenna as well as defining the hot and cold junction. Once again, substrate 36, 39 may be employed. In this embodiment, connecting posts 40, 41 are preferably of resistive material and the ferrite beads are not required. Clamps 43 and 44 may be used to secure the thermocouple films to the resistive connecting posts, and of course, will be of dielectric material.

FIG. 5 shows that the hot junction of the thermocouple is created between the resistive films 37, 38 at necked down portions thereof.

Figure 7A:
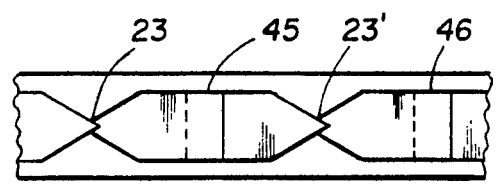
FIGS. 7A and 7B are top and side views of another sensor assembly according to the invention; wherein a plurality of thermocouples are serially interconnected.
Figure 7B:
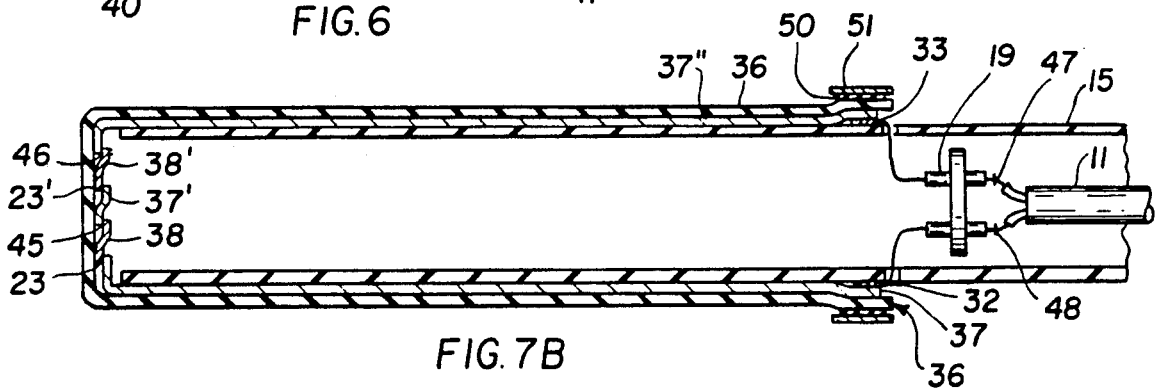

FIGS. 7A and 7B illustrate an arrangement of several thermocouples in tandem. For convenience of identification, primed numbers are used to designate the various portions of the thermocouple. Presuming the use of antimony and bismuth, as previously described, resistive antimony films 37, 37' and 37" are alternated with resistive bismuth films 38, 38'. This forms two hot junctions 23 and 23' and two internal cold junctions 45, 46. The outer resistive elements 37 may be either films or solid conductors shaped at the upper end to connect with the thermocouple. Preferably, these outer elements form a substantially right angle with the plane in which the thermocouples reside, and then interconnect with conductors 47, 48 in the probe. A substrate 36 may be used to support the element.

To obtain isotropic performance, three dipoles may be positioned orthogonal to each other. If two orthogonal dipoles are used, as disclosed above, the unit will be independent of polarization in the plane of the dipoles. The use of the three dipoles also requires resistive coupling, either in the form of film or rods, to the metering instrumentation since these leads will have to be tangential to some component of the E field if all three dipoles are being used.

Another purpose of resistive connections from the resistive dipoles to the metering instrument is to isolate this coupling so that any resonant or frequency responsive characteristic of the leads will not cause a frequency responsive output of the dipole that would reduce the broad band characteristic.

Figure 8:
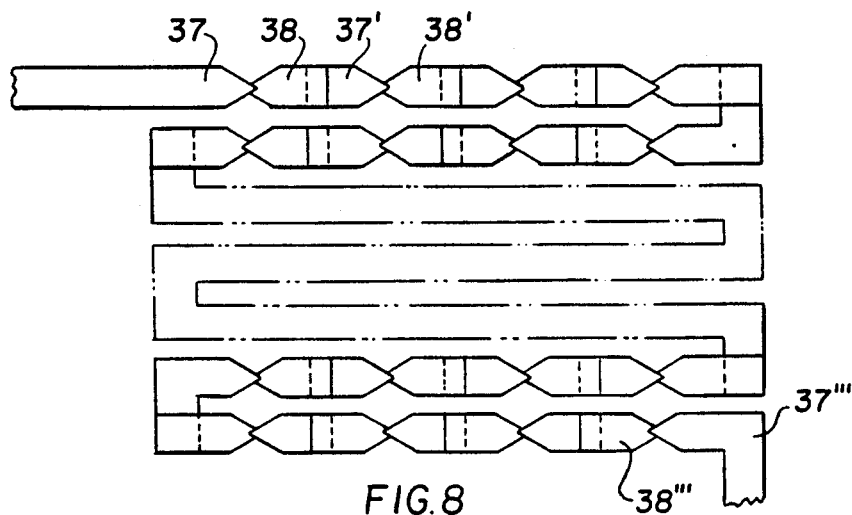
FIG. 8 is a schematic showing the layout of an array of thermocouple dipoles according to another embodiment of the invention.

An array of dipoles in a plane, as shown in FIG. 8, may also be used in lieu of a single dipole. This reduces the reactance thus providing wider bandwidth. A very high resistance film terminating a highly conductive dipole might theoretically provide a broad band system; however, this would be impractical for thin films since the extremely thin films used are unstable and subject to radical changes in sensitivity. Distributing the resistance over the length of the dipole makes it possible to overcome this limitation. The system is essentially a "low Q" circuit.

Several specific embodiments of a radiation monitor and probe assembly have been described. It will be appreciated that variations and modifications in these embodiments may be conceived by those skilled in the art. All such variations and modifications coming within the scope of the above disclosure and the appended claims, are intended to be covered by these claims.

What is claimed is:

1. A radiation detector comprising a sensor assembly mounted at one end of an elongated handle, said sensor assembly including first metallic films for converting free space electromagnetic radiation into direct current voltage, said films including overlapping films forming hot and cold thermocouple junctions, said overlapping films including thin films of dissimilar metals, said thin films being resistive and converting alternating currents induced by said radiation into thermal energy, the hot and cold junctions of said films having electrical and thermal conductivities selected to cause said alternating currents to heat said hot junction to a higher temperature than said cold junction and produce said direct current voltage, said handle including conductive members aligned with the direction of elongation and electrically connected to said thermocouples thereby to provide said direct current voltage to a voltage measuring apparatus.

2. A radiation detector as specified in claim 1 wherein said sensor assembly includes second conductive films, substantially orthogonal to said first conductive films.

3. A radiation detector as specified in claim 1 or 2 wherein said overlapping films further include highly conductive films, and wherein said hot junction is formed by the overlapping ends of said thin resistive films with each other and wherein said cold junctions are formed by the overlapping ends of said thin resistive films and said highly conductive films.

* * * * *